(12) United States Patent
Gao

(10) Patent No.: US 9,426,935 B2
(45) Date of Patent: Aug. 23, 2016

(54) METHOD FOR MANUFACTURING CIRCUIT BOARD, CIRCUIT BOARD, AND ELECTRONIC DEVICE

(71) Applicant: Huawei Device Co., Ltd., Shenzhen (CN)

(72) Inventor: Chunyu Gao, Shenzhen (CN)

(73) Assignee: Huawei Device Co., Ltd., Shenzhen (CN)

( * ) Notice: Subject to any disclaimer, the term of this patent is extended or adjusted under 35 U.S.C. 154(b) by 367 days.

(21) Appl. No.: 14/139,253

(22) Filed: Dec. 23, 2013

(65) Prior Publication Data

US 2014/0111949 A1    Apr. 24, 2014

Related U.S. Application Data

(63) Continuation of application No. PCT/CN2013/070060, filed on Jan. 5, 2013.

(30) Foreign Application Priority Data

Jan. 9, 2012   (CN) .......................... 2012 1 0004654

(51) Int. Cl.
| | |
|---|---|
| *H05K 7/00* | (2006.01) |
| *H05K 9/00* | (2006.01) |
| *H05K 1/02* | (2006.01) |
| *H05K 3/28* | (2006.01) |

(52) U.S. Cl.
CPC ............ *H05K 9/0081* (2013.01); *H05K 1/0218* (2013.01); *H05K 3/28* (2013.01); *H05K 3/284* (2013.01); *H05K 9/00* (2013.01); *H05K 9/003* (2013.01); *H05K 9/0022* (2013.01); *H05K 9/0045* (2013.01); *H05K 2201/0715* (2013.01); *H05K 2201/1018* (2013.01); *H05K 2203/107* (2013.01); *Y10T 29/49124* (2015.01)

(58) Field of Classification Search
CPC ........................................................ H05K 7/02
USPC ........................................................ 361/729
See application file for complete search history.

(56) References Cited

U.S. PATENT DOCUMENTS

| | | | |
|---|---|---|---|
| 7,659,604 B2 * | 2/2010 | Fujiwara et al. | ............. 257/659 |
| 8,897,019 B1 * | 11/2014 | Shimamura et al. | .......... 361/728 |
| 9,055,682 B2 * | 6/2015 | Mugiya et al. | |

(Continued)

FOREIGN PATENT DOCUMENTS

| | | |
|---|---|---|
| CN | 101098584 A | 1/2008 |
| CN | 101887860 A | 11/2010 |

(Continued)

*Primary Examiner* — Forrest M Phillips

(57) ABSTRACT

Embodiments of the present invention disclose a method for manufacturing a circuit board, and a circuit board. The method includes: separately fixing at least two function modules and a shielding frame on a circuit board, where the shielding frame is located between the at least two function modules; packaging the at least two function modules and the shielding frame by using a plastic package material; cutting the plastic package material corresponding to the top of the shielding frame to a surface of the shielding frame; and covering an outside of the plastic package material and an top part of the shielding frame with a conducting material, and covering a surface of the conducting material with an insulation material. In the embodiments, the cutting height is decreased, the processing time is short, and good manufacturability is provided.

14 Claims, 4 Drawing Sheets

(56) References Cited

U.S. PATENT DOCUMENTS

| | | | |
|---|---|---|---|
| 2002/0080593 A1* | 6/2002 | Tsuge et al. | 361/818 |
| 2006/0158865 A1* | 7/2006 | Ohmi et al. | 361/795 |
| 2006/0258050 A1* | 11/2006 | Fujiwara et al. | 438/112 |
| 2008/0000680 A1 | 1/2008 | Cho et al. | |
| 2008/0055878 A1* | 3/2008 | Salzman | 361/818 |
| 2010/0089633 A1 | 4/2010 | Kaspar | |
| 2010/0108370 A1 | 5/2010 | Kapusta et al. | |
| 2012/0188727 A1* | 7/2012 | Lin et al. | 361/728 |
| 2012/0320559 A1 | 12/2012 | Kimura | |

FOREIGN PATENT DOCUMENTS

| | | |
|---|---|---|
| CN | 102142403 A | 8/2011 |
| CN | 102548239 A | 7/2012 |
| CN | 102610590 A | 7/2012 |
| JP | 2004172176 A | 6/2004 |
| JP | 2005317935 A | 11/2005 |
| JP | 2008288610 A | 11/2008 |
| JP | 2010205869 A | 9/2010 |
| JP | 2011187677 A | 9/2011 |

* cited by examiner

METHOD FOR MANUFACTURING CIRCUIT BOARD, CIRCUIT BOARD, AND ELECTRONIC DEVICE

CROSS-REFERENCE TO RELATED APPLICATIONS

This application is a continuation of International Application No. PCT/CN2013/070060, filed on Jan. 5, 2013, which claims priority to Chinese Patent Application No. 201210004654.2, filed on Jan. 9, 2012, both of which are hereby incorporated by reference in their entireties.

TECHNICAL FIELD

The present invention relates to a method for manufacturing a circuit board, a circuit board, and an electronic device.

BACKGROUND

Since electronic components and transistors are becoming smaller, modules and chips are becoming smaller accordingly. In multiple packaging manners, highly integrated modules and chips are usually integrate parts such as baseband circuits, radio frequency circuits, and antennas. To ensure no interference between a digital signal, a radio frequency signal, and an antenna, chamber separation and shielding processing are required on function modules.

As shown in FIG. 1a-1d, in the prior art, a production process of performing chamber division and shielding in a manner, for example, laser cutting and metal spraying, is as follows:

a) fixing (for example, welding) a device 11 and a device 12 to a substrate 13 of a PCB (Printed Circuit Board) by using, for example, an SMT (Surface Mounted Technology, surface mounted technology), and then packaging the devices by using a plastic package material 15;

b) performing laser cutting, by using, for example, laser, on a part that requires the chamber division, where the cutting starts from an upper surface of the plastic package material 15 to a surface of the substrate 13 of the PCB, and a cutting height is H;

c) performing spraying and filling processing on the surface of the plastic package material 15 and a cutting gap (a part that requires the chamber division) by using a conducting material 14, so as to achieve an objective of chamber division and shielding; and d) performing insulation processing by coating an outside surface of the conducting material 14 with an insulation material 16.

The solution of the prior art requires chamber division by using laser cutting and the H required by the laser cutting is excessively high. As a result, a laser head is heavily worn out and processing costs are excessively high.

SUMMARY

Embodiments of the present invention provide a method for manufacturing a circuit board, and a circuit board, so as to decrease a height of a plastic package material to be cut.

According to one aspect, a method for manufacturing a circuit board is provided, including:

separately fixing at least two function modules and a shielding frame on a circuit board, where the shielding frame is located between the at least two function modules;

packaging the at least two function modules and the shielding frame by using a plastic package material, so as to coat the at least two function modules and the shielding frame;

cutting the plastic package material corresponding to the top of the shielding frame to a surface of the shielding frame; and covering an outside of the plastic package material that is not cut and a top part of the shielding frame with a conducting material, and covering an outside surface of the conducting material with an insulation material.

According to another aspect, a circuit board manufactured by using the foregoing method is provided, including:

a substrate, at least two function modules, and a shielding frame, where the at least two function modules and the shielding frame are fixed on the substrate, and the shielding frame is located between the at least two function modules; two sides of the shielding frame and the at least two function modules are coated with a plastic package material, and a top part of the shielding frame and an outside of the plastic package material are covered with a conducting material, and an outside surface of the conduction material is covered with an insulation material.

In the technical solutions provided in the embodiments of the present invention, at least two function modules and a shielding frame are fixed on a circuit board, where the shielding frame is located between the at least two function modules; the at least two function modules and the shielding frame are packaged by using a plastic package material, so as to coat the at least two function modules and the shielding frame; the plastic package material corresponding to the top of the shielding frame is cut to a surface of the shielding frame; and an outside of the plastic package material that is not cut and a top part of the shielding frame are covered with a conducting material, and an outside surface of the conducting material is covered with an insulation material. In this way, a chamber division part uses the shielding frame, and the cutting height is decreased because the plastic package material changes from originally needing to be directly cut to a surface of a PCB to directly being cut to the surface of the shielding frame.

BRIEF DESCRIPTION OF THE DRAWINGS

To describe the technical solutions in the embodiments of the present invention more clearly, the following briefly introduces the accompanying drawings required for describing the embodiments. Apparently, the accompanying drawings in the following description show merely some embodiments of the present invention, and a person of ordinary skill in the art may still derive other drawings from these accompanying drawings without creative efforts.

DETAILED DESCRIPTION

The following clearly describes the technical solutions in the embodiments of the present invention with reference to the accompanying drawings in the embodiments of the present invention. Apparently, the described embodiments are merely a part rather than all of the embodiments of the present invention. All the other embodiments obtained by a person skilled in the art based on the embodiments of the present invention shall fall within the protection scope of the present invention.

Embodiment 1

Referring to FIG. 2 and FIG. 3a to FIG. 3d, this embodiment provides a method for manufacturing a circuit board, where the method includes the following steps.

Step 101: Separately fix at least two function modules and a shielding frame on a substrate of a circuit board, where the shielding frame is located between the at least two function modules.

Figure 1A:
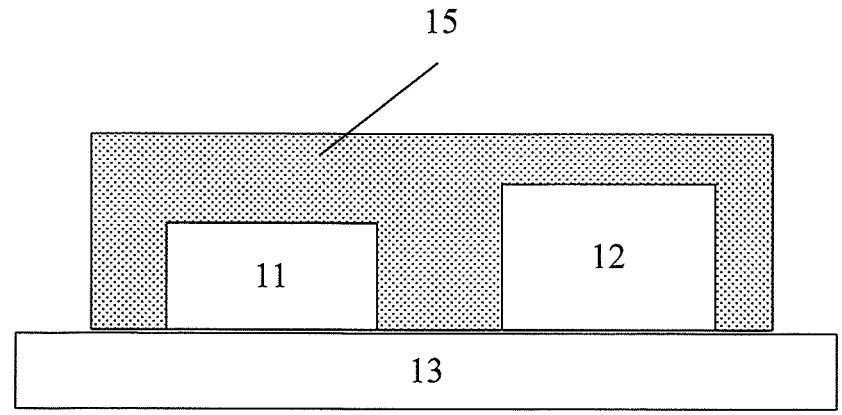
FIG. 1a to FIG. 1d are flowcharts of manufacturing a circuit board in the prior art.
Figure 1B:
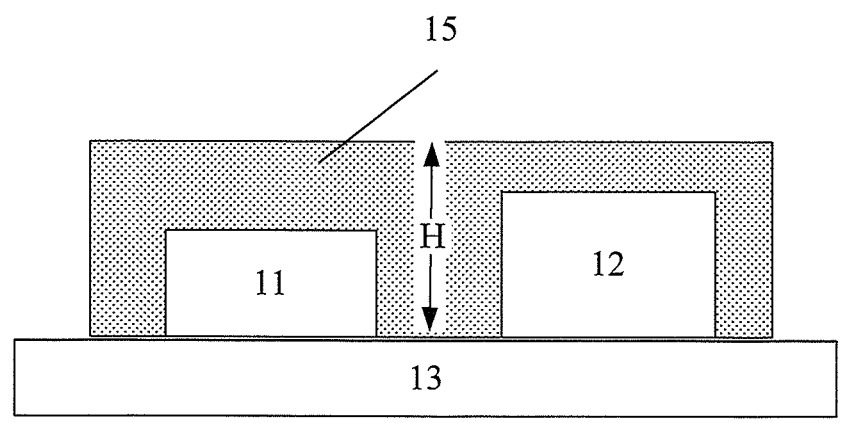
Figure 1C:
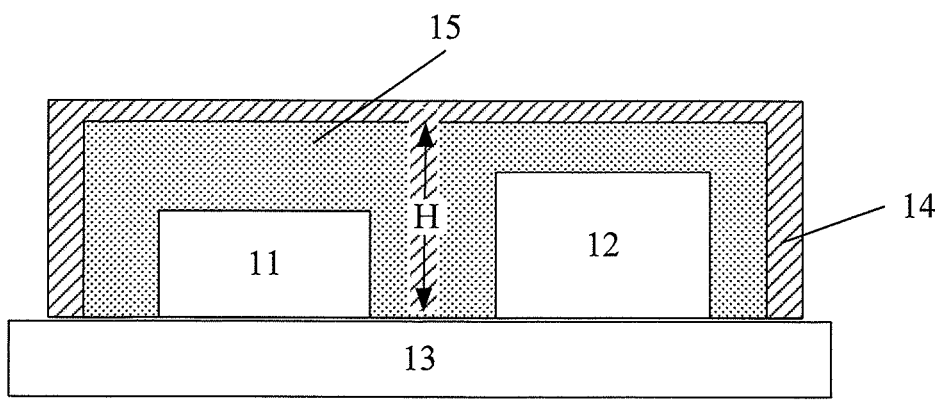
Figure 1D:
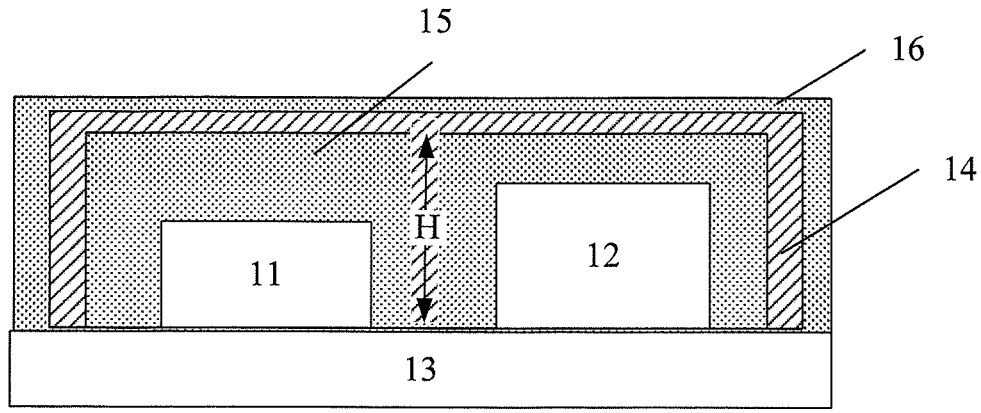
Figure 2:
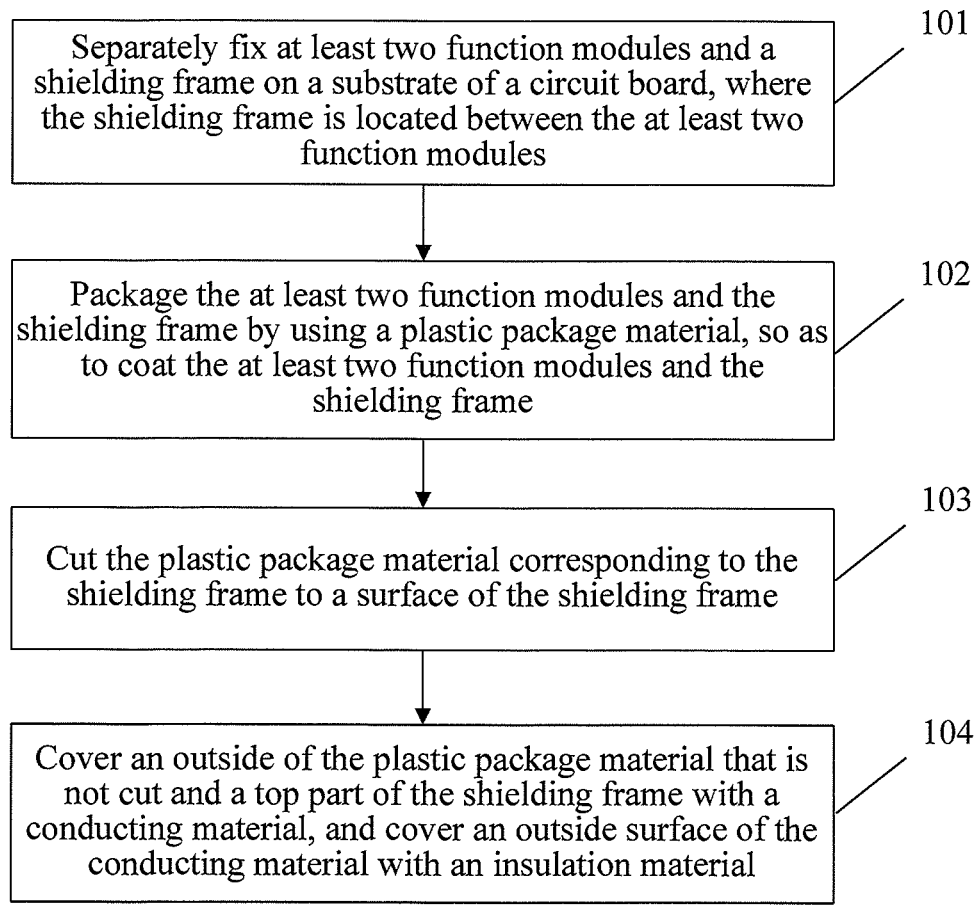
FIG. 2 is a flowchart of a method for manufacturing a circuit board provided in Embodiment 1 of the present invention.
Figure 3A:
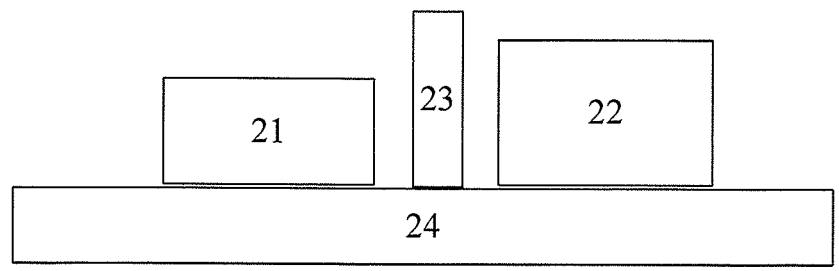
FIG. 3a to FIG. 3d is a schematic diagram of a product corresponding to the process of manufacturing a circuit board provided in Embodiment 1 of the present invention.

Using two function modules as an example, referring to FIG. 3a, a function module 21, a function module 22, and a shielding frame 23 are fixed on a substrate 24 of a circuit board, where the shielding frame 23 is located between the function module 21 and the function module 22.

Step 102: Package the at least two function modules and the shielding frame by using a plastic package material, so as to coat the at least two function modules and the shielding frame.

Figure 3B:
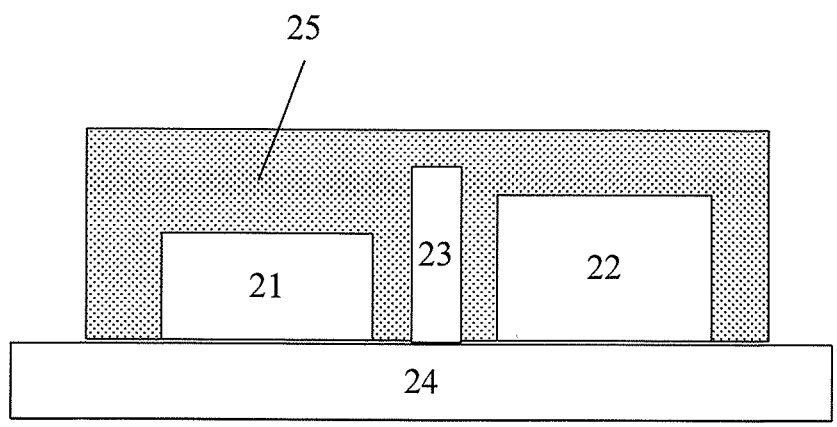

Referring to FIG. 3b, the function modules 21 and 22 and the shielding frame 23 are packaged by using a plastic package material 25, so as to coat the function modules 21 and 22 and the shielding frame 23.

Step 103: Cut the plastic package material corresponding to the top of the shielding frame to a surface of the shielding frame.

Figure 3C:
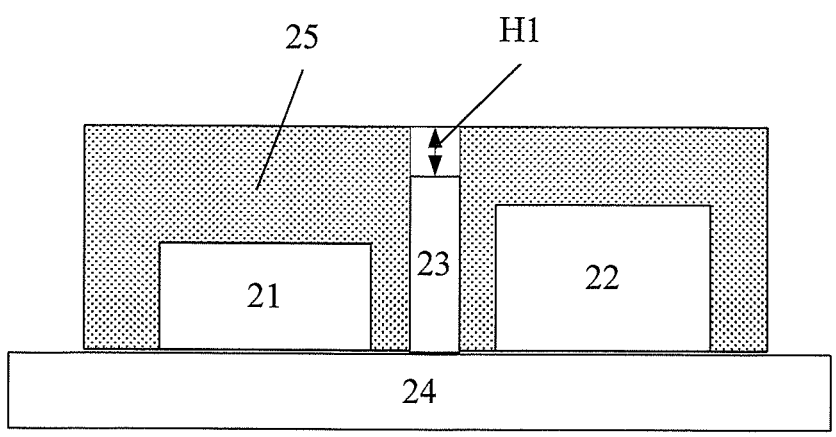

Referring to FIG. 3c, the plastic package material 25 corresponding to the top of the shielding frame 23 is cut to a surface of the shielding frame 23, and a cutting height is H1.

Step 104: Cover an outside of the plastic package material that is not cut and a top part of the shielding frame with a conducting material, and cover an outside surface of the conducting material with an insulation material.

Figure 3D:
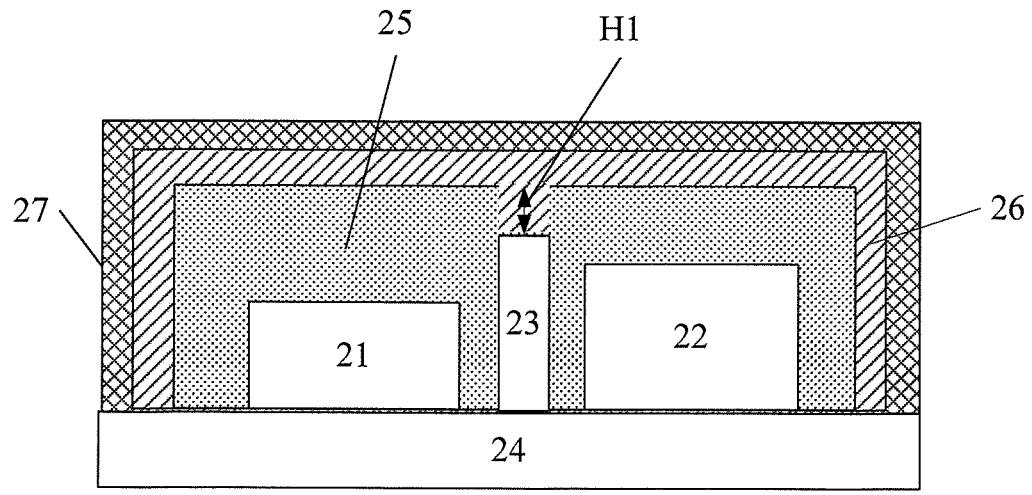

Referring to FIG. 3d, the outside of the plastic package material 25 and the top part of the shielding frame 23 are covered with a conducting material 26, and an outside surface of the conducting material 26 is covered with an insulation material 27.

In this embodiment, the function modules are both a function module on a PCB, and the function module may be a baseband circuit, a radio frequency circuit, an antenna, and the like, which is not specifically limited in this embodiment. The PCB may be a PCB of a mobile phone, or a PCB of a data card, or a PCB of a tablet computer or a microprocessor, which is not specifically limited in this embodiment.

In this embodiment, preferably, a material of the shielding frame includes iron.

In this embodiment, preferably, the conducting material includes copper.

In this embodiment, the cutting the plastic package material corresponding to the top of the shielding frame includes:

performing laser cutting on the plastic package material corresponding to the top of the shielding frame.

In the embodiment of the present invention, at least two function modules and a shielding frame are separately fixed on a circuit board, where the shielding frame is located between the at least two function modules; the at least two function modules and the shielding frame are packaged by using a plastic package material, so as to coat the at least two function modules and the shielding frame; the plastic package material corresponding to the top of the shielding frame is cut to a surface of the shielding frame; and an outside of the plastic package material that is not cut and a top part of the shielding frame are covered with a conducting material, and an outside surface of the conducting material is covered with an insulation material. In this way, a chamber division part uses the shielding frame, and the cutting height is decreased because the plastic package material changes from originally needing to be directly cut to a surface of a PCB to directly being cut to the surface of the shielding frame, and meanwhile, the processing time is short, and good manufacturability is provided.

Embodiment 2

Figure 4:
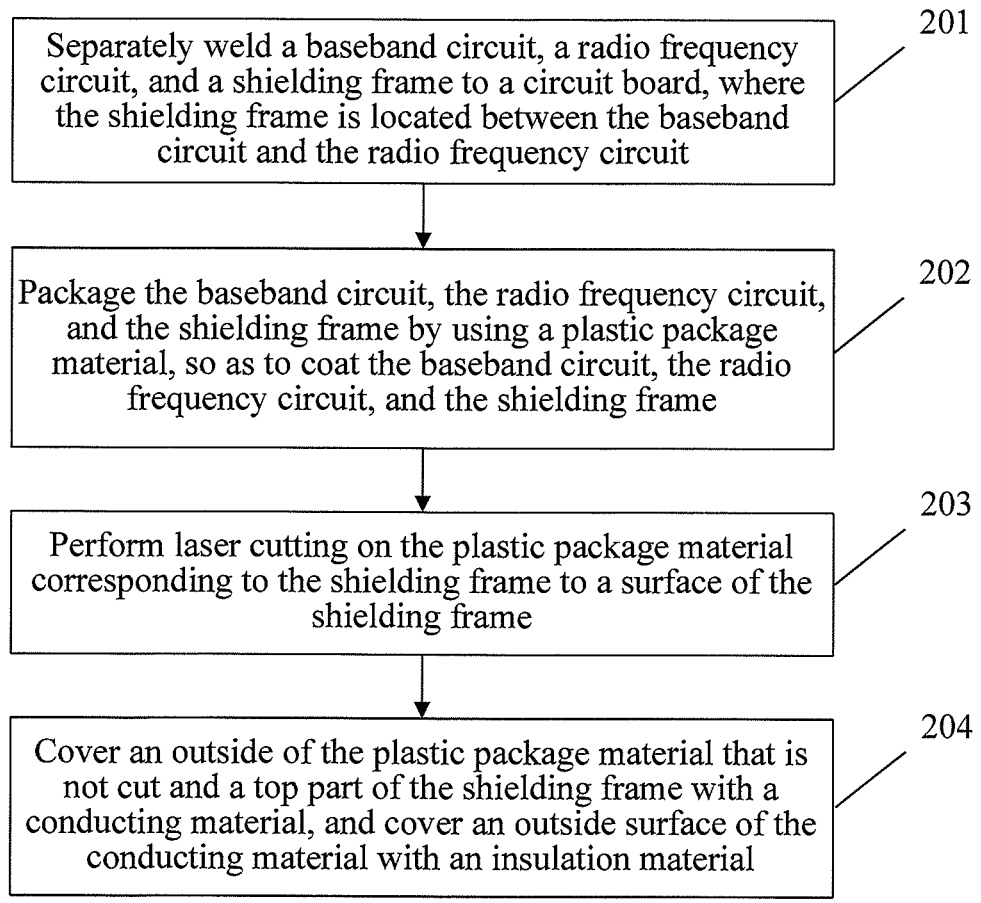
FIG. 4 is a flowchart of a method for manufacturing a circuit board provided in Embodiment 2 of the present invention.

Referring to FIG. 4, in this embodiment, a circuit board of a mobile phone is manufactured by using a method for manufacturing a circuit board provided in Embodiment 1. A process of the method includes the following steps.

Step 201: Separately weld a baseband circuit, a radio frequency circuit, and a shielding frame to a substrate of a circuit board, where the shielding frame is located between the baseband circuit and the radio frequency circuit.

In this embodiment, the description is made by using an example where the baseband circuit is a first function module and the radio frequency circuit is a second function module, but the first function module and the second function module are not limited thereto. The baseband circuit and the radio frequency circuit may be welded to the substrate of the PCB by using, for example, an SMT; in this embodiment, a shielding frame is welded between the baseband circuit and the radio frequency circuit, and the shielding frame separates the baseband circuit from the radio frequency circuit; to achieve an objective of chamber division between the baseband circuit and the radio frequency circuit, preferably, a height of the shielding frame needs to be slightly greater than those of the baseband circuit and the radio frequency circuit. In specific implementation, if a maximum height of the baseband circuit is greater than a maximum height of the radio frequency circuit, the height of the shielding frame needs to be greater than that of the baseband circuit; and if the maximum height of the radio frequency circuit is greater than the maximum height of the baseband circuit, the height of the shielding frame needs to be greater than that of the radio frequency circuit. However, a specific height of the shielding frame is not specifically limited in this embodiment, and may be specifically designed according to a size of a mobile phone.

To achieve a better effect of chamber division, preferably, a material of the shielding frame may be iron in this embodiment, but is not limited thereto, and this embodiment does not impose a specific limitation to this.

In this embodiment, a position of the shielding frame may be determined according to positions acquired in advance, of the baseband circuit and the radio frequency circuit; when the PCB is welded by using the SMT, the baseband circuit, the radio frequency circuit, and the shielding frame are welded to the substrate of the PCB at the same time, or separately welded to the substrate of the PCB in a certain sequence, which is not specifically limited in this embodiment.

Step 202: Package the baseband circuit, the radio frequency circuit, and the shielding frame by using a plastic package material, so as to coat the baseband circuit, the radio frequency circuit, and the shielding frame.

In this embodiment, after the baseband circuit, the radio frequency circuit, and the shielding frame are welded, the circuit board is plastically packaged, where preferably, a height of the plastic packaging is greater than that of the shielding frame to achieve the objective of chamber division, but the height of the plastic packaging is not specifically limited in this embodiment. There are multiple types of plastic package material, which is not specifically limited in this embodiment.

Step 203: Perform laser cutting on the plastic package material corresponding to the top of the shielding frame to a surface of the shielding frame.

In this embodiment, to achieve the effect of chamber division, preferably, the cutting the plastic package material corresponding to the top of the shielding frame includes: performing laser cutting on the plastic package material corresponding to the top of the shielding frame, where the cutting is not limited to the method of laser cutting, and is not specifically limited in this embodiment.

In this embodiment, the plastic package material plastically packaged to a surface of the shielding frame is cut to the surface of the shielding frame, where the cutting height is H'; compared with cutting to a surface of a PCB substrate in the prior art, the cutting height is greatly decreased, and meanwhile, a laser head is less worn out, thereby reducing costs.

Step 204: Cover an outside of the plastic package material that is not cut and a top part of the shielding frame with a conducting material, and cover an outside surface of the conducting material with an insulation material.

In this embodiment, to implement chamber division to achieve a shielding effect, the outside of the plastic package material and the shielding frame that is exposed after cutting are covered with a layer of conducting material. To make the shielding effect better, preferably, the conducting material is copper and definitely may be another material capable of achieving the shielding effect, which is not specifically limited in this embodiment.

In this embodiment, after coverage of the conducting material, to ensure the shielding effect, a thickness of the conducting material on the shielding frame is at least 0.1 mm (millimeter).

In this embodiment, to ensure the EMC (Electro Magnetic Compatibility, electromagnetic compatibility) of the whole equipment, the shielding processing needs to be performed on the whole equipment. In this embodiment, preferably, the surface of the conducting material is covered with a layer of insulation material, so as to achieve an effect of shielding the whole equipment.

In the embodiment of the present invention, a baseband circuit, a radio frequency circuit, and a shielding frame are fixed on a substrate of a circuit board, where the shielding frame is located between the baseband circuit and the radio frequency circuit; the baseband circuit and the radio frequency circuit are packaged by using a plastic package material, so as to coat the baseband circuit and the radio frequency circuit; the plastic package material corresponding to the top of the shielding frame is cut to a surface of the shielding frame; and an outside of the plastic package material that is not cut and the top part of the shielding frame are covered with a conducting material, and an outside surface of the conducting material is covered with an insulation material. In this way, a chamber division part uses the shielding frame, and the cutting height is decreased because the plastic package material changes from originally needing to be directly cut to a surface of a PCB to directly being cut to the surface of the shielding frame, and meanwhile, the processing time is short, and good manufacturability is provided.

Embodiment 3

This embodiment provides a circuit board manufactured by using the method provided in Embodiment 1. Referring to FIG. 3d, the circuit board includes a substrate 24, at least two function modules 21 and 22, and a shielding frame 23, where the at least two function modules 21 and 22 and the shielding frame 23 are fixed on the substrate 24, and the shielding frame 23 is located between the at least two function modules 21 and 22; two sides of the shielding frame 23 and the at least two function modules 21 and 22 are coated with a plastic package material 25, and a top part of the shielding frame 23 and an outside of the plastic package material 25 are covered with a conducting material 26, and an outside surface of the conducting material 26 is covered with an insulation material 27.

In this embodiment, the function modules are both a function module on a PCB, and the function module may be a baseband circuit, a radio frequency circuit, an antenna, and the like, which is not specifically limited in this embodiment. The PCB may be a PCB of a mobile phone, or a PCB of a data card, or a PCB of a tablet computer or a microprocessor, which is not specifically limited in this embodiment.

In this embodiment, preferably, a material of the shielding frame includes iron.

Preferably, the conducting material includes copper.

This embodiment further provides an electronic device, including the foregoing circuit board.

The electronic device includes a mobile phone, a data card, a tablet computer, or a microprocessor or the like.

In the embodiment of the present invention, the circuit board includes a substrate, at least two function modules, and a shielding frame, where the at least two function modules and the shielding frame are fixed on the substrate, and the shielding frame is located between the at least two function modules; two sides of the shielding frame and the at least two function modules are coated with a plastic package material, and a top part of the shielding frame and an outside of the plastic package material are covered with a conducting material, and an outside surface of the conducting material is covered with an insulation material. In this way, the cutting height of the circuit board is decreased because the plastic package material changes from originally needing to be directly cut to a surface of a PCB to directly being cut to the surface of the shielding frame, the processing time is short, and good manufacturability is provided.

The foregoing descriptions are merely exemplary embodiments of the present invention, but are not intended to limit the present invention. Any modification, equivalent replacement, or improvement made without departing from the spirit and principle of the present invention should fall within the protection scope of the present invention.

What is claimed is:

1. A method for manufacturing a circuit board, the method comprising:

separately attaching at least two function modules and a shielding frame on a substrate of a circuit board, wherein the shielding frame is located between the at least two function modules and does not overlie either of the at least two function modules;

packaging the at least two function modules and the shielding frame by using a plastic package material, so as to coat the at least two function modules and the shielding frame;

removing a portion of the plastic package material corresponding to a width of the shielding frame, the portion extending from a top surface of the package material to a top surface of the shielding frame; and covering an outer surface of the plastic package material that is not removed and the top surface of the shielding frame with a conducting material, and covering an outer surface of the conducting material with an insulation material.

2. The method according to claim 1, wherein a material of the shielding frame comprises iron.

3. The method according to claim 1, wherein the conducting material comprises copper.

4. The method according to claim 2, wherein the conducting material comprises copper.

5. The method according to claim 1, wherein removing the portion of the plastic package material corresponding to the width of the shielding frame comprises: performing laser cutting on the plastic package material.

6. The method according to claim 1, wherein the shielding frame and each of the at least two function modules has a respective height, wherein the height of the shielding frame is greater than a height of either of the at least two function modules.

7. The circuit board according to claim 1, wherein the shielding frame and each of the at least two function modules has a respective height, wherein the height of the shielding frame is greater than a height of either of the at least two function modules.

8. The electronic device according to claim 1, wherein the shielding frame and each of the at least two function modules has a respective height, wherein the height of the shielding frame is greater than a height of either of the at least two function modules.

9. A circuit board comprising:
   a substrate;
   at least two function modules;
   a shielding frame, wherein the at least two function modules and the shielding frame are attached to the substrate, the shielding frame is located between the at least two function modules, and the shielding frame does not overlie either of the at least two function modules;
   wherein two sides of the shielding frame and the at least two function modules are coated with a plastic package material;
   wherein a top surface of the shielding frame and an outer surface of the plastic package material are covered with a conducting material; and
   wherein an outer surface of the conducting material is covered with an insulation material.

10. The circuit board according to claim 9, wherein a material of the shielding frame comprises iron.

11. The circuit board according to claim 9, wherein the conducting material comprises copper.

12. The circuit board according to claim 10, wherein the conducting material comprises copper.

13. An electronic device, comprising:
    a circuit board comprising,
       a substrate;
       at least two function modules;
       a shielding frame, wherein the at least two function modules and the shielding frame are attached to the substrate, the shielding frame is located between the at least two function modules, and the shielding frame does not overlie either of the at least two function modules;
    wherein two sides of the shielding frame and the at least two function modules are coated with a plastic package material;
    wherein a top surface of the shielding frame and an outer surface of the plastic package material are covered with a conducting material; and
    wherein an outer surface of the conducting material is covered with an insulation material.

14. The electronic device according to claim 13, comprising a mobile phone, a data card, a tablet computer, or a microprocessor.

* * * * *